United States Patent [19]

Leibowitz

[11] Patent Number: 4,689,110
[45] Date of Patent: Aug. 25, 1987

[54] METHOD OF FABRICATING MULTILAYER PRINTED CIRCUIT BOARD STRUCTURE

[75] Inventor: Joseph D. Leibowitz, Culver City, Calif.

[73] Assignee: TRW Inc., Redondo Beach, Calif.

[21] Appl. No.: 817,327

[22] Filed: Jan. 9, 1986

Related U.S. Application Data

[62] Division of Ser. No. 564,952, Dec. 22, 1983, Pat. No. 4,591,659.

[51] Int. Cl.⁴ .......................... H05K 3/06; H05K 1/03
[52] U.S. Cl. .................................... 156/634; 156/253; 156/901; 174/68.5; 361/388; 361/414; 427/96; 427/97
[58] Field of Search ............... 156/629, 630, 632, 634, 156/253, 901; 174/68.5; 361/386, 387, 388, 414; 427/96, 97; 428/901

[56] References Cited

U.S. PATENT DOCUMENTS

| | | | |
|---|---|---|---|
| 3,952,231 | 4/1976 | Davidson et al. | 361/386 |
| 4,294,877 | 10/1981 | Graham | 428/901 X |
| 4,318,954 | 3/1982 | Jensen | 174/68.5 X |
| 4,388,136 | 6/1983 | Huie et al. | 174/68.5 X |
| 4,414,264 | 11/1983 | Olson | 428/901 X |
| 4,456,712 | 6/1984 | Christie et al. | 428/901 X |
| 4,472,762 | 9/1984 | Spinelli et al. | 361/386 |
| 4,495,378 | 1/1985 | Dötzer et al. | 174/68.5 |
| 4,521,262 | 6/1985 | Pellegrino | 156/634 X |
| 4,522,667 | 6/1985 | Hanson et al. | 156/634 X |
| 4,526,835 | 7/1985 | Takahashi et al. | 428/901 X |

FOREIGN PATENT DOCUMENTS

54-126284 10/1979 Japan .................................. 156/634

*Primary Examiner*—S. Leon Bashore
*Assistant Examiner*—Andrew J. Anderson
*Attorney, Agent, or Firm*—Noel F. Heal

[57] ABSTRACT

A composite printed circuit board structure including multiple layers of graphite interleaved with layers of a dielectric material, such as a polytetrafluoroethylene (PTFE) and woven glass laminate. Some of the dielectric layers are copper clad, and at least some of the graphite layers are positioned in close proximity to the copper cladding layers, to provide good heat dissipation properties. The PTFE provides a desirably low dielectric constant and the graphite also provides good mechanical strength and a low or negative coefficient of thermal expansion, to permit matching of the coefficient with that of chip carriers used to mount components on the circuit board.

6 Claims, 3 Drawing Figures

METHOD OF FABRICATING MULTILAYER PRINTED CIRCUIT BOARD STRUCTURE

This is a division, of application Ser. No. 564,952, filed Dec. 22, 1983, now U.S. Pat. No. 4,591,650.

BACKGROUND OF THE INVENTION

This invention relates generally to printed circuit boards, and more particularly, to printed circuit boards on which microelectronic components or chips are mounted. One desirable characteristic of printed circuit boards used for this purpose is that they should be mechanically stable under conditions of varying temperature. This is particularly important in circuit boards used to support microelectronic components housed in chip carriers.

Chip carriers are usually fabricated from a ceramic material, such as aluminum oxide, and are produced in the form of a hermetically sealed package for each chip. Bonded leads are brought out from the chip to the edges of the chip carrier, and the carrier is then usually soldered, by its leads, directly to a circuit board. The principal advantage of this structure is a significantly higher circuit density. Also, the use of shorter and more uniform lead lengths results in improved speed and impedance characterisitics. Another consideration is that the use of chip carriers substantially reduces the overall cost of a circuit package. Package size reductions as high as a five-to-one ratio can be obtained, compared with an equivalent dual in-line package construction.

A major drawback to the use of chip carriers is that the coefficient of thermal expansion of aluminum oxide, the most commonly used chip carrier material, is approximately one-half the coefficient of thermal expansion for glass-epoxy laminates typically used in the manufacture of circuit boards. When the resulting structure is exposed to any significant range of temperatures, the thermal cycling of the structure can crack soldered joints and render the circuit inoperative. One solution to this problem is to use an intermediate member between the chip carrier and the circuit board. The circuit board is sometimes referred to as a mother board, and the intermediate member as a baby board. The intermediate member may also take the form of a hybrid package on which the chip carrier is mounted. Another technique is to use a compliant lead structure between the chip carrier and the circuit board, although this clearly increases the cost of the package and results in inherently long lead lengths.

Accordingly, an ideal circuit board should have a coefficient of thermal expansion that closely matches that of chip carriers mounted on the board. If there is a substantial mismatch in coefficients of thermal expansion, the chip carrier may break loose from the board, or the electrical connections may be damaged.

Another difficulty that has arisen as larger numbers of components are mounted on circuit boards, is that the heat produced by the components must be dissipated in some manner, whether by conduction through the circuit board or by radiative, convective, or forced-air cooling. Since the principal materials used in circuit boards are insulators, the boards themselves have traditionally played no significant role in dissipating heat from the components that they support.

A third factor in the design of circuit boards is that they should ideally be of a material with a relatively low dielectric constant, to enhance the board's ability to propagate signals over relatively long distances.

Some materials, such as polytetrafluoroethylene (PTFE) have good dielectric properties but an undesirably high coefficient of thermal expansion. Kevlar (trademark of E.I. du Pont de Nemours & Co., Inc.) has a negative coefficient of thermal expansion, and may be used to reduce the average coefficient of thermal expansion in a composite circuit board structure. However, Kevlar is a poor thermal conductor, and therefore does nothing to enhance the thermal conduction properties of the board.

U.S. Pat. No. 4,318,954 issued to Jensen, proposes the use of a single thick layer of graphite reinforced with a resin, to adjust the coefficient of thermal expansion of a circuit board. The technique disclosed in the patent is to use a large bulk of graphite, such that the composite expansion coefficient approaches that of the graphite alone. However, the Jensen patent does not provide any solution to the increasing problem of heat dissipation.

It will be appreciated from the foregoing that there is an ever increasing need for a multilayer printed circuit board structure that addresses these problems. Specifically, the ideal circuit board structure should have low dielectric properties, a low or negative thermal coefficient of thermal expansion, and good thermal conduction properties to enhance heat conduction from devices mounted on the board. The present invention satisfies all of these needs.

SUMMARY OF THE INVENTION

The present invention resides in a multilayer printed circuit board structure in which multiple layers of graphite are employed both to reduce the coefficient of thermal expansion and to provide enhanced thermal conductivity, and multiple layers of a PTFE material are used to provide the necessary dielectric properties. More specifically, the layers of graphite are spaced symmetrically across the thickness of the circuit board, to minimize the possibility of bowing of the board during temperature changes, and at least some of the layers of graphite are positioned in close proximity to copper layers in the board, to provide enhanced thermal conduction from the mounted components.

The graphite layers in the structure of the invention take the form of woven sheets of fabric that have been impregnated with a bonding material, such as an epoxy resin. An alternative preferred construction, in which high modulus carbon fiber material is used, takes the form of alternative layers of unidirectional fibers, the fibers in each layer being more or less parallel to one another and the alternate layer fiber directions being arranged to provide stiffness and strength along the major axes of the structure of the invention. Each graphite sheet is separated from adjacent copper or dielectric layers by a thin layer of insulating adhesive material. The adhesive serves both to bond the two layers together and to electrically insulate the copper layers from the graphite. Holes may be formed through the graphite, either for plated-through connectors between copper layers, or to accommodate mounting screws used to secure the board structure to a housing. At each of the predetermined hole positions, the graphite sheets are pre-drilled and the holes are filled with a bonding adhesive material, such as the epoxy resin used to form the sheets. When via holes or mounting screw holes are subsequently drilled through the composite board, a drill of smaller diameter is used. In this way, each hole through a graphite layer has an annular sheath of insulating material around it, and no inadvertent connection is made between copper layers. However, the insulation around the mounting screws is thin enough to provide only a small resistance to the flow of heat.

It will be appreciated from the foregoing that the present invention represents a significant advance in the field of multiple-layer printed circuit boards. In particular, the invention provides a circuit board in which the coefficient of thermal expansion may be substantially reduced, and matched to that of an adjacent chip carrier. Moreover, the board of the invention has good thermal conductivity properties, excellent mechanical strength, and does not sacrifice dielectric performance. Other aspects and advantages of the invention will become apparent from the following more detailed description, taken in conjunction with the accompanying drawings.

DESCRIPTION OF THE PREFERRED EMBODIMENT

Figure 1:
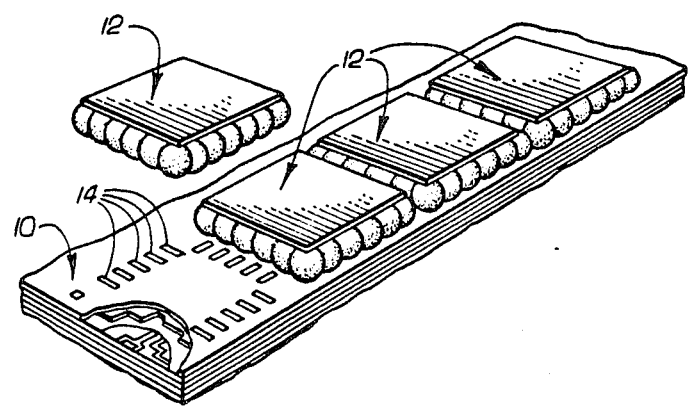
FIG. 1 is a simplified perspective view showing four chip carriers mounted on a circuit board.

As shown in the drawings for purposes of illustration, the present invention is principally concerned with multilayer printed circuit boards. There are three desirable properties of circuit boards, especially those used to support electronic components on ceramic chip carriers. First, the board should have a relatively low dielectric constant, to facilitate transmission of signals over relatively long distances. Second, the coefficent of thermal expansion of the board should be controllable to some degree, to match the coefficient of adjacent materials, such as chip carriers. Finally, the board should ideally be a sufficiently good thermal conductor to assist in the dissipation of heat generated in mounted components. Unfortunately, these three desired characteristics cannot be found in a single material.

FIG. 1 shows a multilayer circuit board, indicated by reference numeral 10, used to support four chip carriers 12. The chip carriers 12 have leads brought out to their edges and extending around beneath the carriers. The leads are then attached to the circuit board 10 by a reflow soldering process in which the leads are secured to respective pads 14 on the top of the circuit board 10. Any mismatch between the coefficients of thermal expansion of the chip carriers 12 and the board 10 can result in damage to the electrical chip connections.

Figure 2:
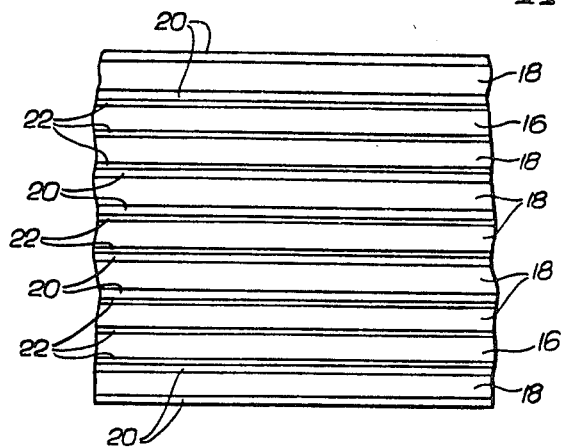
FIG. 2 is a fragmentary cross-sectional view of a multilayer circuit board made in accordance with the invention.

In accordance with the invention, and as shown diagrammatically in FIG. 2, the circuit board 10 includes a plurality of layers of graphite 16 interleaved between layers 18 of a dielectric material that includes polytetrafluoroethylene (PTFE). Some of the layers 18 are copper coated, as indicated at 20. The PTFE layers 18 provide the basic dielectric material of the board 10, and the graphite layers 16 provide both thermal conductivity and control of thermal coefficient of expansion. The graphite layers 16 are bonded to adjacent copper layers 20 or PTFE layers 18 with a suitable adhesive layer 22. For the copper-to-graphite bond, the adhesive 22 also functions as an electrical insulator, to avoid having the graphite act as an unwanted electrical connection between portions of the copper layers. The adhesive layers 22 are, however, so thin that they offer little resistance to the flow of heat between the copper and the graphite.

Figure 3:
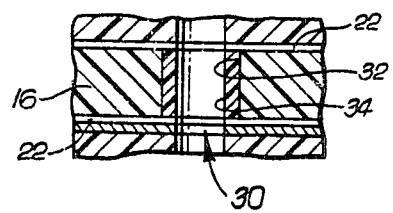
FIG. 3 is a fragmentary view showing how via holes and mounting screw holes are formed in the board of the invention.

The graphite layers 16 are formed from fibrous carbon material, such as "Thornel" P100 or P75S, made by Union Carbide Corporation, Carbon Products Division, Chicago, Ill. 60606. The graphite or carbon yarn is woven into a cloth, which is then impregnated with a bonding material, such as an epoxy resin. In an alternative preferred embodiment, which incorporates high modulus carbon fibers, the carbon fibers are arranged in each layer so that they are more or less parallel to one another and are not woven into cloth, since such weaving may result in damage to the brittle high modulus fibers. Alternate layers are then arranged so that the combination of fiber directions in the layers provides the required rigidity and strength along the major axes of the circuit board. The resin-impregnated graphite cloth cures to a hard, rigid sheet, with practically planar surfaces. Hole locations, such as indicated at 30 in FIG. 3, are predetermined, and the graphite sheets are pre-drilled with oversized holes 32, which are immediately filled with more resin material. Then the graphite boards 16 are ready to be laminated with the PTFE layers 18, usng the adhesive 22.

Prior to lamination, the copper layers 20 are appropriately patterned as dictated by the design of circuits mounted on the board. After lamination, holes are made through the entire board 10, but using a smaller diameter drill than the one used to pre-drill the graphite layers 16. Thus, each newly formed hole 34 is surrounded by an annular sheath of insulating material, which serves to electrically separate the graphite layers 16 from the copper layers 20, but is thin enough to permit transmission of heat from the copper.

The number and thickness of the graphite layers 16 are selected to provide a desired effect on the composite coefficient of thermal expansion of the board 10. In addition, the graphite layers 16 are disposed in a symmetrical fashion across the thickness of the board 10, to minimize the possibility of bending of the board during temperature changes. The coefficient of thermal expansion of the graphite layers 16 is close to zero after impregnation with epoxy resin. The coefficient of thermal expansion for copper is $9.4 \times 10^{-6}$ in/in/°F., and the coefficient for copperclad PTFE sheets is much higher. The goal in selecting the number and thickness of the graphite layers 16 is to match the coefficient of thermal expansion to that of the chip carrier material. The most common material, aluminum oxide, has a coefficient of thermal expansion of $3.33 \times 10^{-6}$ in/in/°F.

The PTFE layers 18 may be part of a suitable material, such as CU-CLAD 233, manufactured by the Electronics Products Division of the 3M Company, St. Paul, Minn. 55144. This material is a laminate of PTFE and woven glass. It has a low dielectric constant of 2.33, but a relatively high coefficient of thermal expansion. Appropriate selection and positioning of the graphite layers 16 results in a composite coefficient of thermal expansion that closely matches that of the chip carrier material.

One of the principal advantages of the use of graphite in the circuit board structure is that it serves as a good conductor of heat, which normally can flow from the mounted components through the copper layers of the board, through mounting bolts, and thence to a housing or other heat sink. In the structure of the invention, the graphite layers 16 provide a parallel path for the flow of heat, and thereby improve the heat dissipation characteristics of the circuit package. Another advantage of the use of graphite is that it is mechanically extremely strong. The tensile modulus of elasticity for single yarns of the graphite specified above is in the range $75-100 \times 10^6$ p.s.i., but this is naturally reduced when the graphite is impregnated with resin. Nevertheless, the use of graphite greatly stengthens the circuit board structure.

It will be appreciated from the foregoing that the present invention represents a significant advance in the field of multilayer printed circuit boards. In particular, the use of multiple layers of graphite in a circuit board is used to control the coefficient of thermal expansion and to provide a supplementary thermal path for the dissipation of heat from components mounted on the board. The base material used in the board is PTFE with a desirably low dielectric constant.

It will also be appreciated that, although a specific embodiment of the invention has been described in detail for purposes of ilustration, various modifications may be made without departing from the spirit and scope of the invention. Accordingly, the invention is not to be limited except as by the appended claims.

I claim:

1. A method of fabrication of circuit boards, comprising the steps of:
    impregnating a woven graphite cloth with a resin to form a plurality of solid graphite sheets;
    etching a plurality of copper-clad sheets of polytetrafluoroethylene (PTFE) and woven glass with predefined circuit patterns; and
    laminating the graphite sheets and the copper-clad sheets, together with other sheets of PTFE and woven glass, to form a composite printed circuit board;
    wherein at least some of the graphite sheets are positioned in close proximity to some of the copper-clad sheets to provide a low resistance path for the flow of heat from the copper circuit patterns;
    and wherein the graphite sheets are positioned in a symmetrical manner with respect to the thickness of the composite board and selected in number to provide a desired composite coefficient of thermal expansion.

2. A method as set forth in claim 11, wherein said laminating step includes:
    applying an insulating adhesive layer between each graphite sheet and adjacent layers, whereby the adhesive layer also electrically insulates the graphite and copper cladding materials.

3. A method as set forth in claim 12, and further including the steps of:
    pre-drilling the graphite sheets, prior to said laminating step, at predetermined locations for via holes and mounting screw holes;
    filling the pre-drilled holes with a resin; and
    drilling the laminated board at the predetermined hole locations, using a smaller diameter drill, to leave an annular sheath of insulating resin around each hole through a graphite sheet.

4. A method of fabrication of circuit boards, comprising the steps of:
    impregnating a layer of unidirectional graphite fibers with a resin to form a plurality of solid graphite sheets;
    etching a plurality of copper-clad sheets of polytetrafluoroethylene (PTFE) and woven glass with predefined circuit patterns; and
    laminating the graphite sheets and the copper-clad sheets, together with other sheets of PTFE and woven glass, to form a composite printed circuit board;
    wherein at least some of the graphite sheets are positioned in close proximity to some of the copper-clad sheets to provide a low resistance path for the flow of heat from the copper circuit patterns;
    and wherein the graphite sheets are positioned in a symmetrical manner with respect to the thickness of the composite board and selected in number to provide a desired composite coefficient of thermal expansion.

5. A method as set forth in claim 4, wherein said laminating step includes:
    applying an insulating adhesive layer between each graphite sheet and adjacent layers, whereby the adhesive layer also electrically insulates the graphite and copper cladding materials.

6. A method as set forth in claim 5, and further including the steps of:
    pre-drilling the graphite sheets, prior to said laminating step, at predetermined locations for via holes and mounting screw holes;
    filling the pre-drilled holes with a resin; and
    drilling the laminated board at the predetermined hole locations, using a smaller diameter drill, to leave an annular sheath of insulating resin around each hole through a graphite sheet.

* * * * *